US009741442B2

(12) United States Patent
Pichen

(10) Patent No.: US 9,741,442 B2
(45) Date of Patent: Aug. 22, 2017

(54) SYSTEM AND METHOD OF READING DATA FROM MEMORY CONCURRENTLY WITH SENDING WRITE DATA TO THE MEMORY

(71) Applicant: SANDISK TECHNOLOGIES INC., Plano, TX (US)

(72) Inventor: Abdulla Pichen, Bangalore (IN)

(73) Assignee: SanDisk Technologies LLC, Plano, TX (US)

(*) Notice: Subject to any disclaimer, the term of this patent is extended or adjusted under 35 U.S.C. 154(b) by 480 days.

(21) Appl. No.: 13/875,477

(22) Filed: May 2, 2013

(65) Prior Publication Data
US 2014/0269088 A1 Sep. 18, 2014

(30) Foreign Application Priority Data

Mar. 12, 2013 (IN) .......................... 1019/CHE/2013

(51) Int. Cl.
G06F 12/00 (2006.01)
G06F 13/00 (2006.01)
G11C 16/32 (2006.01)
G06F 13/16 (2006.01)
G11C 7/10 (2006.01)
G11C 16/10 (2006.01)
G11C 16/26 (2006.01)

(52) U.S. Cl.
CPC .......... G11C 16/32 (2013.01); G06F 13/1626 (2013.01); G11C 7/1039 (2013.01); G11C 7/1042 (2013.01); G11C 16/10 (2013.01); G11C 16/26 (2013.01); G11C 2207/2209 (2013.01)

(58) Field of Classification Search
USPC ........................................................ 711/103
See application file for complete search history.

(56) References Cited

U.S. PATENT DOCUMENTS

| 5,559,952 | A | 9/1996 | Fujimoto | |
|---|---|---|---|---|
| 6,025,695 | A * | 2/2000 | Friel et al. | 320/106 |
| 6,345,000 | B1 | 2/2002 | Wong et al. | |
| 6,654,836 | B1 * | 11/2003 | Misra et al. | 710/110 |
| 7,679,970 | B2 | 3/2010 | Hong | |

(Continued)

FOREIGN PATENT DOCUMENTS

CN        1732516 A    2/2006

OTHER PUBLICATIONS

International Search Report and Written Opinion of the International Searching Authority (EPO) for International Application No. PCT/US2014/021362, mailed Jun. 23, 2014, 9 pages.

(Continued)

Primary Examiner — Sean D Rossiter
(74) Attorney, Agent, or Firm — Toler Law Group, PC

(57) ABSTRACT

A data storage device includes a memory, a controller, and a communication bus coupled to the memory and to the controller. The controller is configured to send a read-write command and write data to the memory via the communication bus. The read-write command indicates an address of requested data to be read from the memory. The controller is further configured to receive the requested data read from the memory. Communicating the requested data over the communication bus overlaps the write data being stored into the memory.

22 Claims, 3 Drawing Sheets

(56) References Cited

U.S. PATENT DOCUMENTS

| | | |
|---|---|---|
| 8,189,422 B2 | 5/2012 | Lee et al. |
| 2004/0128464 A1* | 7/2004 | Lee et al. ............... 711/171 |
| 2006/0085493 A1* | 4/2006 | Kim et al. ............... 707/206 |
| 2007/0097780 A1 | 5/2007 | Chen et al. |
| 2008/0183984 A1* | 7/2008 | Beucler et al. ............ 711/155 |
| 2010/0088484 A1* | 4/2010 | Roohparvar ......... G11C 7/1018 |
| | | 711/168 |
| 2011/0093669 A1 | 4/2011 | Davis et al. |
| 2011/0185114 A1 | 7/2011 | Bolanowski |
| 2011/0298300 A1* | 12/2011 | Gray et al. ............... 307/116 |

OTHER PUBLICATIONS

International Preliminary Report on Patentability for International Application No. PCT/US2014/021362, issued Sep. 15, 2015, 6 pages.
Office Action dated Nov. 18, 2016 in European Patent Application No. 14712517.3, 4 pages.
First Office Action mailed Dec. 6, 2016 in Chinese Application No. 201480008486.1 with English Translation, 42 pages.

\* cited by examiner

SYSTEM AND METHOD OF READING DATA FROM MEMORY CONCURRENTLY WITH SENDING WRITE DATA TO THE MEMORY

CROSS-REFERENCE TO RELATED APPLICATIONS

The present application claims priority from Indian Application No. 1019/CHE/2013, filed Mar. 12, 2013, the contents of which are incorporated by reference herein in their entirety.

FIELD OF THE DISCLOSURE

The present disclosure is generally related to retrieving data from and storing in a data storage device.

BACKGROUND

Non-volatile data storage devices, such as universal serial bus (USB) flash memory devices or removable storage cards, have allowed for increased portability of data and software applications. Flash memory devices may take more time to perform a write operation than to perform a read operation. When a read operation for reading data stored in the flash memory device is requested while a write operation is being performed, the flash memory device may complete the write operation before performing the read operation, which may cause latency in reading the stored data.

SUMMARY

Latency of reading data stored in a memory of a data storage device may be improved by reading data from the memory of the data storage device concurrently with transferring write data to the memory of the data storage device. A read-write command and write data may be sent from a controller of the data storage device. The read-write command indicates requested data to be read from the memory. The requested data is read from the memory while write data is transferred from the controller. After transfer of the write data from the controller has completed, the requested data may be sent from to the controller while the write data is written into the memory.

DETAILED DESCRIPTION

Figure 1:
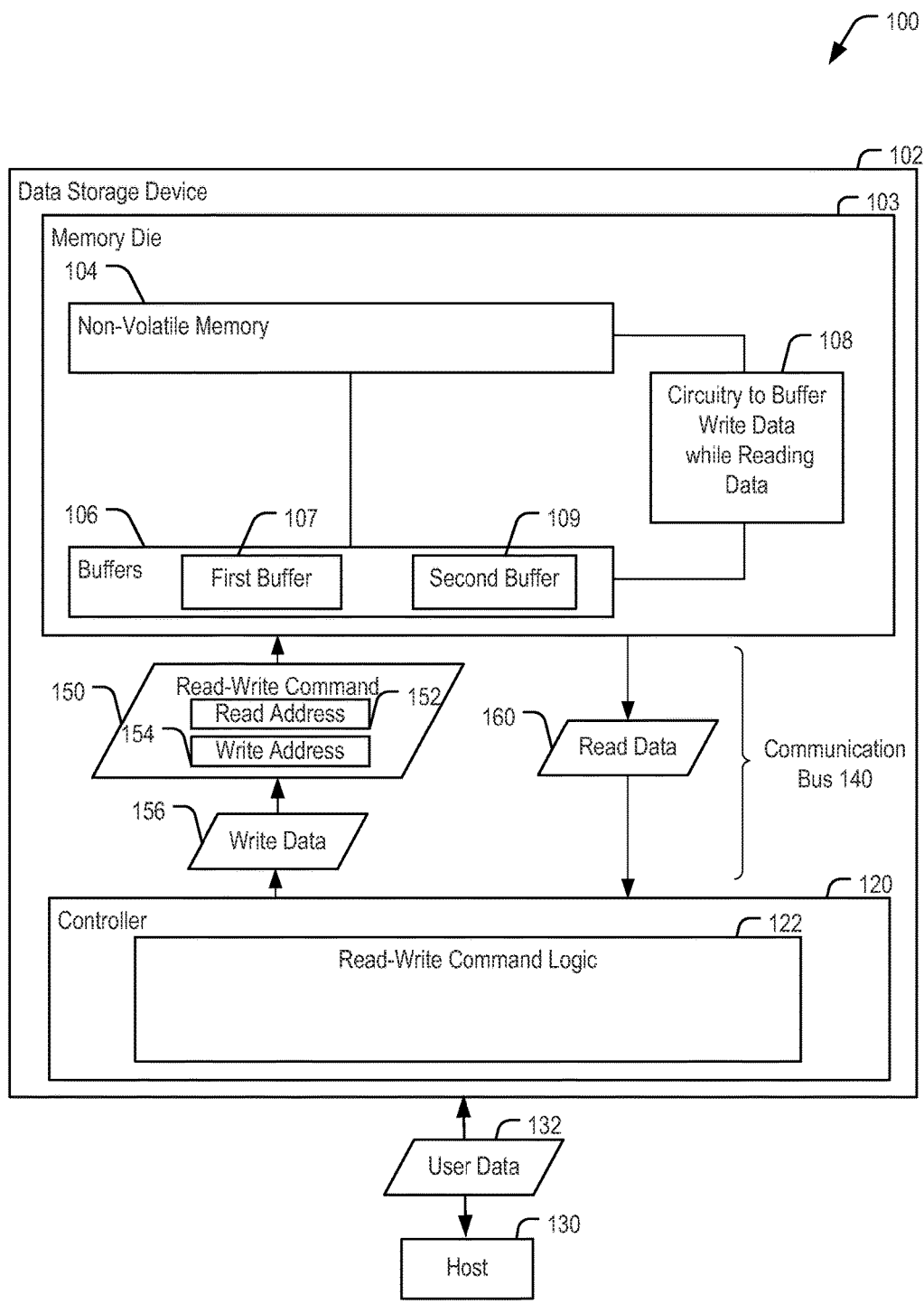
FIG. 1 is a block diagram of a particular illustrative embodiment of a system including a data storage device including a controller configured to receive requested data read from a memory at least partially concurrently with write data being stored into the memory.

Referring to FIG. 1, a particular embodiment of a system 100 includes a data storage device 102 coupled to a host device 130. The data storage device 102 includes a memory die 103 coupled to a controller 120 via a communication bus 140. The data storage device 102 is configured to send requested data from the memory die 103 to the controller 120. Sending the requested data to the controller 120 overlaps with write data 156 being written to a memory 104 on the memory die 103.

The host device 130 may be configured to provide data, such as the user data 132, to be stored at the memory 104 or to request data to be read from the memory 104. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 communicates via a memory interface that enables reading from the memory 104 and writing to the memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the memory 104 in accordance with any other suitable communication protocol.

The data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory die 103 may include the memory 104, a set of buffers 106, and circuitry 108 to buffer write data in the set of buffers 106 on the memory die 103 while reading requested data from the memory 104. The memory 104 may be a non-volatile memory, such as a NAND flash memory, and may be configured to store the requested data to be read from the memory die 103 (e.g., a flash die). The memory 104 may include multiple groups of storage elements, such as word lines, pages, or blocks. As an example, the memory 104 may include a multi-level cell (MLC) flash memory.

The set of buffers 106 may include a first buffer 107 and a second buffer 109. The set of buffers 106 may be configured to store requested data, such as read data 160, that is read from the memory 104 while the memory die 103 receives the write data 156 from the controller 120. For example, the first buffer 107 may be configured to store at least a portion of the requested data 160 that is read from the memory 104 while at least a portion of the write data 156 is received via the communication bus 140 and stored to the second buffer 109.

The circuitry 108 may be configured to enable the set of buffers 106 to store the requested data 160 that is read from the memory 104 while the memory die 103 receives the write data 156 from the controller 120. For example, the circuitry 108 may be responsive to receipt of a read-write command 150 to enable the first buffer 107 to store at least a portion of the requested data 160 read from the memory 104 while at least a portion of the write data 156 is received via the communication bus 140 and stored to the second buffer 109.

The controller 120 may be configured to receive data and instructions from and to send data to the host device 130 while the data storage device 102 is operatively coupled to the host device 130. The controller 120 may further be configured to send data and commands to the memory 104 and to receive data from the memory 104. For example, the controller 120 may be configured to send data and a write command to instruct the memory 104 to store the data to a specified address. As another example, the controller 120 may be configured to send a read command to read data from a specified address of the memory 104.

The controller 120 includes read-write command logic 122 that is configured to generate the read-write command 150. The read-write command 150 includes a read address 152 and a write address 154. The read address 152 may correspond to a read location in the memory 104 and the write address 154 may correspond to a write location in the memory 104. For example, data read from the memory 104, such as the requested data 160, may be read from the read location in the memory 104 and data sent to the memory 104, such as the write data 156, may be sent to the write location in the memory 104.

The controller 120 may be configured to send the read-write command 150 and the write data 156 to the memory die 103 via the communication bus 140 to instruct the memory 104 to read the requested data 160 from the specified read address 152 of the memory 104 and to store the write data 156 to the specified write address 154 of the memory 104. For example, the controller 120 may be configured to send the write data 156 to the memory die 103 by placing the write data 156 onto the communication bus 140, and the memory die 103 may be configured to receive the write data 156 by retrieving the write data 156 from the communication bus 140 and storing the write data 156 to the second buffer 109. The controller 120 may further be configured to receive the requested data 160 read from the memory 104 while the write data 156 is being stored into the memory 104. For example, the memory die 103 may be configured to place the requested data 160 that is stored in the first buffer 107 onto the communication bus 140, and the controller 120 may be configured to receive the requested data 160 by retrieving the requested data 160 from the communication bus 140 while the write data 156 is being sent from the second buffer 109 to the memory 104.

During operation, in response to receiving a read request for the requested data 160 from the host device 130 while a write operation is ongoing, the controller 120 may initiate a data read operation at the memory 104. The data read operation may be initiated by the controller 120 during data transfer of the write data 156 to the memory die 103 via the communication bus 140. For example, in response to receiving the read request, the controller 120 may send the read-write command 150 and the write data 156 to the memory die 103 via the communication bus 140. The requested data 160 may be read from the read address 152 of the memory 104 while the write data 156 is being transferred to the memory die 103. At least a portion of the requested data 160 read from the memory 104 may be stored to the first buffer 107 while at least a portion of the write data 156 is concurrently stored to the second buffer 109. In one implementation, the requested data 160 read from the memory 104 may remain in the first buffer 107 until transmission of the write data 156 to the memory die 103 via the communication bus 140 is complete. Upon completion of data transfer of the write data 156 on the communication bus 140 to the memory die 103, the controller 120 may receive the read data 160 from the memory die 103 via the communication bus 140.

As another example, when the data storage device 102 is performing a sequential write operation, such as when storing multiple sets of data to sequential addresses in the memory 104, and a read request is received from the host device 130, one or more write operations of the sequential write operation may be replaced with a read-write operation. The controller 120 may send the read-write command 150 and the write data 156 to the memory die 103 via the communication bus 140 as described above. For example, a read request from the host device 130 may have a higher priority than a write request from the host device 130. When a read operation for reading the read data 160 stored in the memory 104 is requested by the host device 130 while a sequential write operation is being performed, the controller 120 may replace one or more write operations of the sequential write operation with the read-write command 150. As a result, reduced read latency may be experienced by the host device 130.

By receiving the requested data 160 read from the memory 104 at least partially concurrently with the write data 156 being stored into the memory 104, and by reading the requested data 160 from the memory 104 while the write data 160 is being transferred to the memory die 103, reduced read latency may be experienced by the host device 130 as compared to systems without the read-write command 150.

Figure 2:
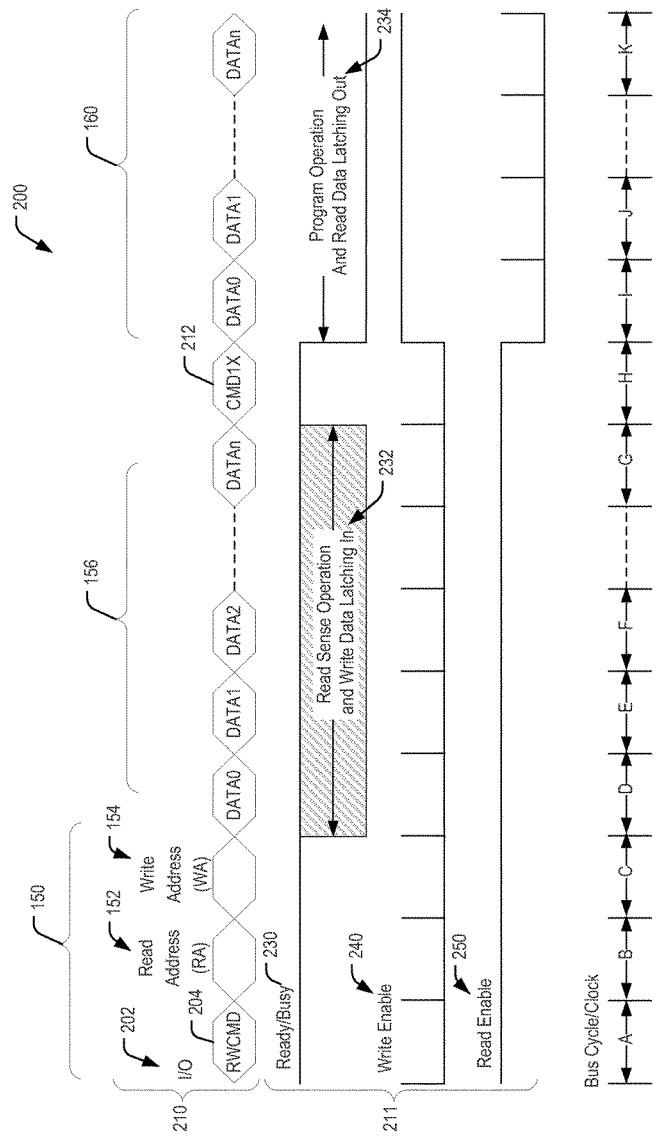
FIG. 2 is a timing diagram illustrating a particular embodiment of signals and data associated with the read-write command of the data storage device of FIG. 1.

Referring to FIG. 2, a timing diagram 200 illustrating a particular embodiment of signals and data associated with the read-write command 150 of FIG. 1 is shown. The timing diagram 200 illustrates data transfer with reference to signaling on the communication bus 140 of FIG. 1. However, it should be understood that the read-write command 150 and the communication bus signaling illustrated in FIG. 2 may be implemented in devices or systems other than the data storage device 102 of FIG. 1.

The communication bus 140 may include multiple lines that are logically grouped into an input/output (I/O) portion 210 and control signaling 211. Data that is transferred via the I/O portion 210 is illustrated as an I/O trace 202. The control signaling 211 includes a ready/busy signal 230, a write enable signal 240, and a read enable signal 250.

The ready/busy signal 230 may be asserted by the memory die 103 of FIG. 1 to indicate when the memory die 103 is busy with an erase, program, or read operation. For example, the ready/busy signal 230 may be asserted low (e.g., "busy") when the memory die 103 is busy with an erase, program, or read operation and may be asserted high (e.g., "ready") otherwise.

The write enable signal 240 may be responsible for clocking data, address, or command information into the memory die 103. To illustrate, in a write operation, data to be programmed, such as the write data 156, may be "clocked" (e.g., synchronously transferred as sequential data words) from I/O lines of the communication bus 140 into the buffers 106 on rising edges of the write enable signal 240.

The read enable signal 250 may enable output data buffers, such as one or more of the buffers 106. For example, data that has been read from the memory 104 and that is stored in the buffers 106 may be clocked from the buffers 106 onto I/O lines of the communication bus 140 on rising edges of the read enable signal 250.

The I/O trace 202 illustrates data transfer to and from the memory die 103. The I/O trace 202 includes a plurality of data transfer units. For example, the plurality of data transfer units may be data packets. Each data packet may include multiple bits that are sent in parallel over multiple lines of the input/output portion 210 of the communication bus 140 during a bus cycle. The data packets may include a command identifier packet 204 and a command termination packet 212. The command identifier packet 204 may include a set of bits to identify the read-write command 150. The command termination packet 212 may indicate that write data transfer is complete.

The read-write command 150 is illustrated with reference to various signals on lines of the communication bus 140 and includes a header (e.g., a command identifier packet 204), the read address 152, and the write address 154. The read-write command 150 and associated data are illustrated as being transferred during multiple bus cycles, illustrated as bus cycle A, bus cycle B, bus cycle C . . . bus cycle K.

During bus cycle A, the command indicator 204 indicating the read-write command 150 may be transferred via a communication bus between a controller and a memory die. To illustrate, the controller 120 may write the command indicator 204 onto the I/O portion 210 of the communication bus 140 and may drive a rising edge of the write enable signal 240. The memory die 103 may receive the command indicator 204 by reading the command indicator 204 from the communication bus 140, such as by clocking data from the I/O lines 202 into the buffers 106 on a rising edge of the write enable signal 240.

During bus cycle B and bus cycle C, one or more read addresses and write addresses may be transferred via the communication bus between the controller and the memory die. For example, the controller 120 may put the read address 152 and the write address 154 on the communication bus 140 during bus cycle B and bus cycle C, respectively. The memory die 103 may receive the read address 152 and the write address 154 by reading the read address 152 and the write address 154 from the communication bus 140 of FIG. 1, such as by clocking the read address 152 and the write address 154 into the buffers 106 on a rising edge of the write enable signal 240 during bus cycle B and bus cycle C.

The write data 156 is illustrated as transferred during bus cycles D-G. For example, the controller 120 may write sequential portions of the write data 156 onto the I/O portion 210 during sequential bus cycles and may raise the write enable signal 240 to signal to the memory die 103 to read each portion from the I/O lines 202. The memory die 103 may receive the write data 156 by reading the write data 156 from the communication bus 140, such as by clocking sequential portions of the write data 156 into the buffers 106 on a rising edge of the write enable signal 240.

Concurrently with the controller 120 sending the write data 156 and the memory die 103 receiving the write data 156 during bus cycles D-G, the memory die 103 may perform a read operation 232 to read data from a location in the memory 104 corresponding to the read address 152. Data read from the memory 104 may be stored into the buffers 106 for later transfer to the controller 120 via the communication bus 140 after the write data 156 has been transferred. While the read operation 232 is ongoing, the ready/busy signal 230 may be asserted by the memory die 103 indicating that the read operation 232 is being performed in the memory die 103. The ready/busy signal 230 may remain asserted until the read operation 232 is complete. However, in other implementations, the ready/busy signal 230 may not be asserted while the read operation 232 is being performed.

During bus cycle H, an indication that write data transfer is complete may be transferred via the communication bus between the controller and the memory die. For example, the controller 120 may put the command termination packet 212 on the communication bus 140 during bus cycle H. The memory die 103 may receive the command termination packet 212 by reading the command termination packet 212 from the communication bus 140. The command termination packet 212 may be clocked into the buffers 106 on a rising edge of the write enable signal 240.

During bus cycles I-K (e.g., after the command termination packet 212 is transferred indicating that write data 156 transfer is complete), a write operation 234 may be performed. For example, the write data 156 may be transferred from the buffers 106 to the memory 104. During the write operation 234, the ready/busy signal 230 may be asserted by the memory die 103 (indicating that the memory die 103 is busy), the write enable signal 240 may not be toggled by the controller 120, and the read enable signal 250 may be asserted by the controller 120 and toggled to clock the read data 160 from the buffers 106 onto the communication bus 140. Assertion of the read enable signal 250 during the write operation 234 may enable the requested data 160 to be transferred from the memory die 103 via the bus 140 to the controller 120 of FIG. 1 during bus cycles I-K and the write data 156 to be transferred from the buffers 106 to the memory 104 during bus cycles I-K. For example, the memory die 103 may put the requested data 160 that is stored in the buffers 106 on the communication bus 140. The controller 120 may receive the requested data 160 by reading the requested data 160 from the communication bus 140 during bus cycles I-K.

The read-write command 150 enables multiple operations to overlap. As used herein, "overlap" may mean complete overlap or partial overlap. An example of complete overlap is transferring the write data 156 over the I/O lines 202 and performing the read operation 232, both operations beginning at bus cycle D and ending at bus cycle G. An example of partial overlap is transfer of the portion of the write data 156 designated "Data 1" during bus cycle E while the read operation 232 is ongoing. Although transfer of the "Data 1" portion begins and ends at different times than the read operation 232 begins and ends, both operations are ongoing during bus cycle E, and therefore the operations partially overlap. More than two operations may overlap. For example, during bus cycle F, the controller 120 writes a portion of the write data 156 onto the I/O lines 202, the read operation 232 is (at least partially) performed at the memory 104, the memory die 103 reads the portion of the write data 156 ("Data 2") from the I/O lines 202 and into the buffers 106, and the memory die 103 may transfer a portion of the read data 160 from the memory 104 to the buffers 106. As another example, during bus cycle J, the memory die 103 writes a portion of the read data 160 onto the I/O lines 202 from the buffers 106, the controller 120 reads a portion of the read data 160 from the I/O lines 202, and the write operation 234 is (at least partially) performed at the memory 104. By performing the read operation 232 while the write data 156 is being transferred to the memory die 103, and by performing the write operation 234 while the read data 160 is being transferred to the controller 120, the host device 130 may experience reduced read latency as compared to systems without the read-write command 150.

Although the read operation 232 is illustrated as having an equal duration as transfer of the write data 156, in other implementations the read operation 232 may be completed in a shorter or longer amount of time as compared to an amount of time to transfer the write data 156. If the read operation 232 exceeds the transfer time of the write data 156, one or more bus cycles may elapse where no data is transferred via the I/O lines until the read data 160 is ready to begin transfer to the controller 120. Alternatively, or in addition, transfer of the read data 160 via the I/O lines 202 may begin while the read operation 232 is ongoing. For example, the second buffer 109 of FIG. 1 may function as a first-in-first-out (FIFO) buffer that enables buffered read data to be written onto the communication bus 140 while other read data is being received from the memory 104.

Although the read-write command 150 is illustrated in FIG. 2 as including the command identifier packet 204, the read address 152, and the write address 154, it should be understood that in other embodiment an instruction set definition of the read-write command 150 may define the write command 150 as including or excluding one or more of the components 204, 152, 154, 156, and 212. For example, the command identifier packet 204 may not be transmitted via the I/O lines 202 and instead an indicator of the read-write command 150 may be sent via one or more other lines, such as via a dedicated command line. As another example, the read-write command 150 may be defined as including the command identifier packet 204, or as including the command identifier packet 204 and the command termination packet 212, and may not include one or more of the read address 152, the write address 154, and the write data 156 in the instruction set definition.

Although the read address 152 and the write address 154 are each illustrated as occupying a single bus cycle, in other embodiments, the read address 152, the write address 154, or both, may occupy multiple bus cycles or may be combined in a single bus cycle. For example, a 32-bit address may be transmitted in four bus cycles using an 8-bit bus, in a single bus cycle using a 32-bit bus, or may be combined with another 32-bit address in a single bus cycle using a 64-bit bus. Although the command termination packet 212 is illustrated as being transferred via the I/O lines 202, in other embodiments, a command termination signal may instead be transferred via one or more other lines or no command termination signal may be provided. For example, in an implementation that uses a defined write data block size, the termination packet 212 may be omitted and transfer of the write data 156 may be determined to have ended when an amount of write data corresponding to the defined write data block size has been transmitted (or a corresponding count of bus cycles have elapsed) over the communication bus 140.

Figure 3:
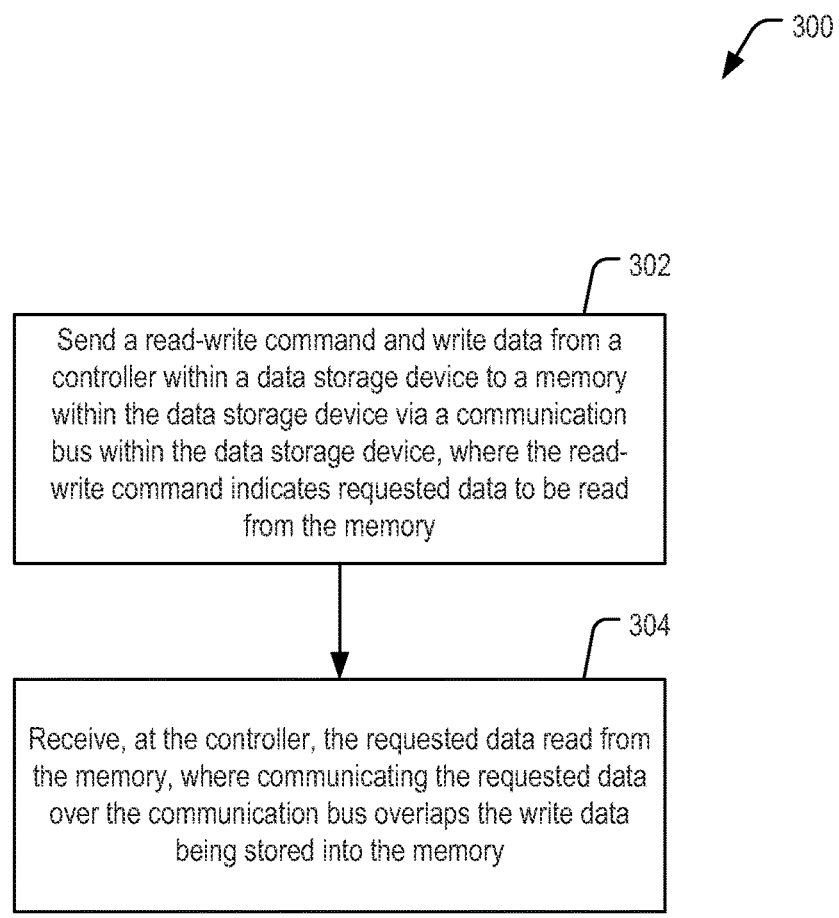
FIG. 3 is a flowchart of a particular illustrative embodiment of a method of receiving requested data read from a memory within a data storage device at least partially concurrently with write data being stored into the memory.

Referring to FIG. 3, a flowchart of an illustrative embodiment of a method 300 of receiving requested data read from a memory within a data storage device at least partially concurrently with write data being stored into the memory is illustrated. The method 300 may be performed by the data storage device 102 of FIG. 1.

A read-write command and write data may be sent from a controller within a data storage device to a memory within the data storage device via a communication bus within the data storage device, at 302. The read-write command may indicate requested data to be read from the memory. For example, in response to receiving a read request for the requested data 160 from the host device 130 while a write operation is ongoing, the controller 120 may send the read-write command 150 and the write data 156 to the memory die 103 via the communication bus 140.

The requested data read from the memory may be received at the controller, where communicating the requested data over the communication bus overlaps the write data being stored into the memory, at 304. For example, the requested data 160 may be received by the controller 120 from the memory die 103 via the communication bus 140 at least partially concurrently with the write data 156 being sent from the buffers 106 to the non-volatile memory 104. At least a portion of the requested data 160 read from the memory 104 may be stored to the first buffer 107 while at least a portion of the write data 156 is concurrently stored to the second buffer 109. The requested data 160 read from the memory 104 may remain in the first buffer 107 until transmission of the write data 156 to the memory die 103 via the communication bus 140 is complete. Upon completion of data transfer of the write data 156 on the communication bus 140, the controller 120 may receive the requested data 160 from the first buffer 107. Receiving the requested data 160 overlaps the write data 156 being sent from the second buffer 109 to the memory 104.

By receiving the requested data 160 read from the memory 104 at the controller 120 at while the write data 156 is being written into the memory 104, reduced read latency may be experienced by the host device 130 as compared to systems without the read-write command 150.

Although various components depicted herein are illustrated as block components and described in general terms, such components may include one or more microprocessors, state machines, or other circuits configured to enable a data storage device, such as the data storage device 102 of FIG. 1, to perform the particular functions attributed to such components. For example, the read-write command logic 122 of FIG. 1, the circuitry 108, or a combination thereof, may represent physical components, such as controllers, processors, state machines, logic circuits, or other structures to receive requested data read from a memory die within the data storage device 102 of FIG. 1, where receiving the requested data overlaps write data being sent to the memory die 103 of FIG. 1.

In a particular embodiment, the data storage device 102 may be implemented in a portable device configured to be selectively coupled to one or more external devices. However, in other embodiments, the data storage device 102 may be embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device that includes a memory, a controller, and a communication bus coupled to the memory and to the controller, performing:
receiving a read-write command from the controller at the memory, wherein the read-write command is received via the communication bus, includes a command identifier data transfer unit that identifies the read-write command, and indicates requested data to be read from the memory;
sensing the requested data from the memory while receiving write data from the controller at the memory; and
communicating the requested data over the communication bus to the controller, wherein transfer of the requested data over the communication bus overlaps storing the write data into the memory.

2. The method of claim 1, further comprising latching at least a portion of the write data during sensing of at least a portion of the requested data from the memory wherein initiating transfer of the requested data over the communication bus overlaps storing the write data into the memory.

3. The method of claim 1, wherein:
the memory is included in a memory die that includes a set of buffers,
at least a portion of the requested data read from the memory is stored to a first buffer of the set of buffers while at least a portion of the write data is stored to a second buffer of the set of buffers, and
a write operation to store the write data into the memory is initiated at a transition of a ready/busy signal to a level indicating that the memory die is busy.

4. The method of claim 1, wherein communicating the requested data over the communication bus to the controller and storing the write data into the memory are each initiated at a beginning of a bus cycle of the communication bus, the bus cycle beginning after receipt of the write data at the memory.

5. The method of claim 1, wherein the read-write command is sent in response to receiving a read request from a host device during performance, at the data storage device, of a write operation that is configured to store the write data into the memory.

6. The method of claim 1, wherein:
the read-write command includes a first address corresponding to a read location in the memory and a second address corresponding to a write location in the memory,
the command identifier data transfer unit includes a command identifier packet that is associated with a header of the read-write command and that includes a set of bits identifying the read-write command, and
the requested data is read from the read location and the write data is sent to the write location.

7. The method of claim 1, wherein:
the write data is received by the memory via the communication bus,
storing the write data into the memory is initiated based on a leading edge of a control signal,
the control signal is asserted onto the communication bus by a memory die that includes the memory, and
the memory includes a flash memory.

8. A data storage device comprising:
a memory;
a controller coupled to the memory; and
a communication bus coupled to the memory and to the controller, wherein the memory is configured to:
receive a read-write command from the controller via the communication bus, wherein the read-write command is configured to indicate requested data to be read from the memory and includes a command identifier data transfer unit configured to identify the read-write command;
sense the requested data from the memory while receiving write data from the controller; and
communicate the requested data over the communication bus to the controller, wherein transfer of the requested data over the communication bus overlaps storage of the write data into the memory.

9. The data storage device of claim 8, further comprising a memory die that includes the memory, wherein:
the memory die is configured to initiate the storage of the write data into the memory, and
initiation of the storage of the write data into the memory is based on a leading edge of a control signal asserted onto the communication bus by the memory die.

10. The data storage device of claim 8, wherein the controller includes read-write command logic configured to generate the read-write command, and further comprising a memory die that includes the memory and circuitry configured to buffer the write data on the memory die while reading the requested data, the memory die configured to initiate a write operation to store the write data into the memory at a transition of a ready/busy signal to a level indicating that the memory die is busy.

11. The data storage device of claim 8, further comprising a memory die that includes the memory, wherein the controller is configured to send the read-write command in response to a read request from a host device during performance, at the memory die, of a write operation that is configured to store the write data into the memory.

12. The data storage device of claim 8, wherein:
the memory includes a non-volatile memory configured to store the requested data to be read from the memory, and
the command identifier data transfer unit includes a command identifier packet.

13. The data storage device of claim 8, further comprising a memory die that includes the memory, wherein:
the memory die is configured to:
latch at least a portion of the write data during sensing of at least a portion of the requested data from the memory; and
transfer the requested data via the communication bus to the controller, and initiation of the transfer of the requested data via the communication bus to the controller overlaps the storage of the write data into the memory.

14. The data storage device of claim 8, further comprising a set of buffers configured to:
store the requested data that is read from the memory; and
store the write data that is sent to the memory.

15. The data storage device of claim 14, wherein the set of buffers includes a first buffer and a second buffer, and wherein the controller is configured to store at least a portion of the requested data read from the memory to the first buffer while at least a portion of the write data is stored to the second buffer.

16. The data storage device of claim 14, wherein the requested data remains in the set of buffers until transmission of the write data via the communication bus is complete.

17. The data storage device of claim 16, wherein, the memory is further configured to, in response to a determination that transmission of the write data is complete, assert a read transfer signal that is configured to prevent the controller from sending a next sequential write command until the requested data has been transferred to the controller.

18. The data storage device of claim 8, further comprising a memory die that includes the memory, the memory die configured to initiate each of communication of the requested data over the communication bus to the controller and the storage of the write data into the memory at a beginning of a bus cycle of the communication bus, the bus cycle beginning after receipt of the write data at the memory.

19. The data storage device of claim 8, wherein:
the read-write command includes a first address corresponding to a read location in the memory and a second address corresponding to a write location in the memory, and
the memory is further configured to read the requested data from the read location and to store the write data to the write location.

20. The data storage device of claim 8, wherein:
the command identifier data transfer unit includes a command identifier packet that is associated with a header of the read-write command and that includes a set of bits configured to identify the read-write command, and
the controller is configured to initiate a data read operation at the memory during data transfer of the write data via the communication bus.

21. An apparatus comprising:
means for storing data;
means for controlling the means for storing data; and
means for communicating data, the means for communicating data coupled to the means for storing data and to the means for controlling, wherein the means for storing data is configured to:
receive a read-write command from the means for controlling via the means for communicating data, the read-write command configured to indicate requested data to be read from the means for storing data and including means for identifying the read-write command;
sense the requested data from the means for storing data while receiving write data from the means for controlling; and
communicate the requested data via the means for communicating data to the means for controlling, wherein initiation of transfer of the requested data over the means for communicating data overlaps storage of the write data into the means for storing data.

22. The apparatus of claim 21, wherein the means for storing data is further configured to latch at least a portion of the write data during sensing of at least a portion of the requested data at the means for storing data.

\* \* \* \* \*